(12) United States Patent
Yao et al.

(10) Patent No.: US 9,837,516 B2
(45) Date of Patent: Dec. 5, 2017

(54) BI-DIRECTIONAL PUNCH-THROUGH SEMICONDUCTOR DEVICE AND MANUFACTURING METHOD THEREOF

(71) Applicant: Silergy Semiconductor Technology (Hangzhou) LTD, Hangzhou, ZheJiang Province (CN)

(72) Inventors: Fei Yao, Zhejiang Province (CN); Shijun Wang, Zhejian Province (CN); Bo Qin, Zhejian Province (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 15/587,518

(22) Filed: May 5, 2017

(65) Prior Publication Data

US 2017/0243965 A1    Aug. 24, 2017

Related U.S. Application Data

(63) Continuation of application No. 15/088,297, filed on Apr. 1, 2016, now Pat. No. 9,679,998.

(30) Foreign Application Priority Data

Apr. 10, 2015    (CN) .......................... 2015 1 0170448

(51) Int. Cl.
*H01L 21/332*    (2006.01)
*H01L 29/74*     (2006.01)
(Continued)

(52) U.S. Cl.
CPC .... *H01L 29/7424* (2013.01); *H01L 29/66386* (2013.01); *H01L 29/747* (2013.01)

(58) Field of Classification Search
CPC ........... H01L 27/0817; H01L 29/66371; H01L 29/66386; H01L 29/7404; H01L 29/7424; H01L 29/747
See application file for complete search history.

(56) References Cited

U.S. PATENT DOCUMENTS 6,459,133 B1    10/2002    Brown et al.
6,858,510 B2    2/2005     Einthoven et al.
(Continued)

FOREIGN PATENT DOCUMENTS

CN    101527324 A    9/2009

*Primary Examiner* — Daniel Shook
(74) *Attorney, Agent, or Firm* — Michael C. Stephens, Jr.

(57) ABSTRACT

In one embodiment, a bi-directional punch-through semiconductor device can include: a first transistor in a first region of a semiconductor substrate of a first conductivity type, where the first transistor includes a semiconductor buried layer of a second conductivity type in the semiconductor substrate, and a first epitaxy region of an epitaxy semiconductor layer above the semiconductor buried layer, the semiconductor buried layer being configured as a base of the first transistor; and a second transistor coupled in parallel with the first transistor, where the second transistor is in a second region of the semiconductor substrate of the first conductivity type, where the second transistor comprises a second epitaxy region of the epitaxy semiconductor layer above the semiconductor substrate, and a first doped region of the second conductivity type in the second epitaxy region, the first doped region being configured as a base of the second transistor.

16 Claims, 10 Drawing Sheets

(51) Int. Cl.
*H01L 29/66* (2006.01)
*H01L 29/747* (2006.01)

(56) References Cited

U.S. PATENT DOCUMENTS 8,987,858 B2 3/2015 Kashyap et al.
2016/0344384 A1* 11/2016 Hague ................ H01L 29/7408

* cited by examiner

BI-DIRECTIONAL PUNCH-THROUGH SEMICONDUCTOR DEVICE AND MANUFACTURING METHOD THEREOF

RELATED APPLICATIONS

This application is a continuation of the following application, U.S. patent application Ser. No. 15/088,297, filed on Apr. 1, 2016, and which is hereby incorporated by reference as if it is set forth in full in this specification, and which also claims the benefit of Chinese Patent Application No. 201510170448.2, filed on Apr. 10, 2015, which is incorporated herein by reference in its entirety.

FIELD OF THE INVENTION

The disclosure generally relates to a semiconductor device and a manufacturing method thereof, and more particularly to bi-directional punch-through semiconductor devices and associated manufacturing methods.

BACKGROUND

Mobile terminals, such as cell phones and other wearable electronics, are becoming increasingly used in many applications. Electronic circuits in mobile terminals can reduce power losses, and may prolong battery lifetime by operating at a relatively low voltage (e.g., 5V). Electronic circuits may withstand a lower maximum voltage as the operating voltage decreases. Thus, a transient voltage suppressor (TVS) with a low breakdown voltage may be utilized for protecting the electronic circuits.

SUMMARY

In one embodiment, a bi-directional punch-through semiconductor device, can include: (i) a first transistor in a first region of a semiconductor substrate of a first conductivity type, where the first transistor includes a semiconductor buried layer of a second conductivity type in the semiconductor substrate, and a first epitaxy region of an epitaxy semiconductor layer above the semiconductor buried layer, the semiconductor buried layer being configured as a base of the first transistor; and (ii) a second transistor coupled in parallel with the first transistor, where the second transistor is in a second region of the semiconductor substrate of the first conductivity type, where the second transistor comprises a second epitaxy region of the epitaxy semiconductor layer above the semiconductor substrate, and a first doped region of the second conductivity type in the second epitaxy region, the first doped region being configured as a base of the second transistor, and where the first and second epitaxy regions have different conductivity types.

In one embodiment, a method of manufacturing a bi-directional punch-through semiconductor device, can include: (i) forming, in a semiconductor substrate of a first conductivity type, a semiconductor buried layer of a second conductivity type; (ii) forming an epitaxy semiconductor layer on the semiconductor substrate, where the epitaxy semiconductor layer includes a first epitaxy region and a second epitaxy region of different conductivity types; (iii) forming a first doped region of the second conductivity type in the second epitaxy region; (iv) forming a second doped region of the first conductivity type in the first epitaxy region; and (v) forming a third doped region of the first conductivity type in the first doped region.

DETAILED DESCRIPTION

Figure 1:
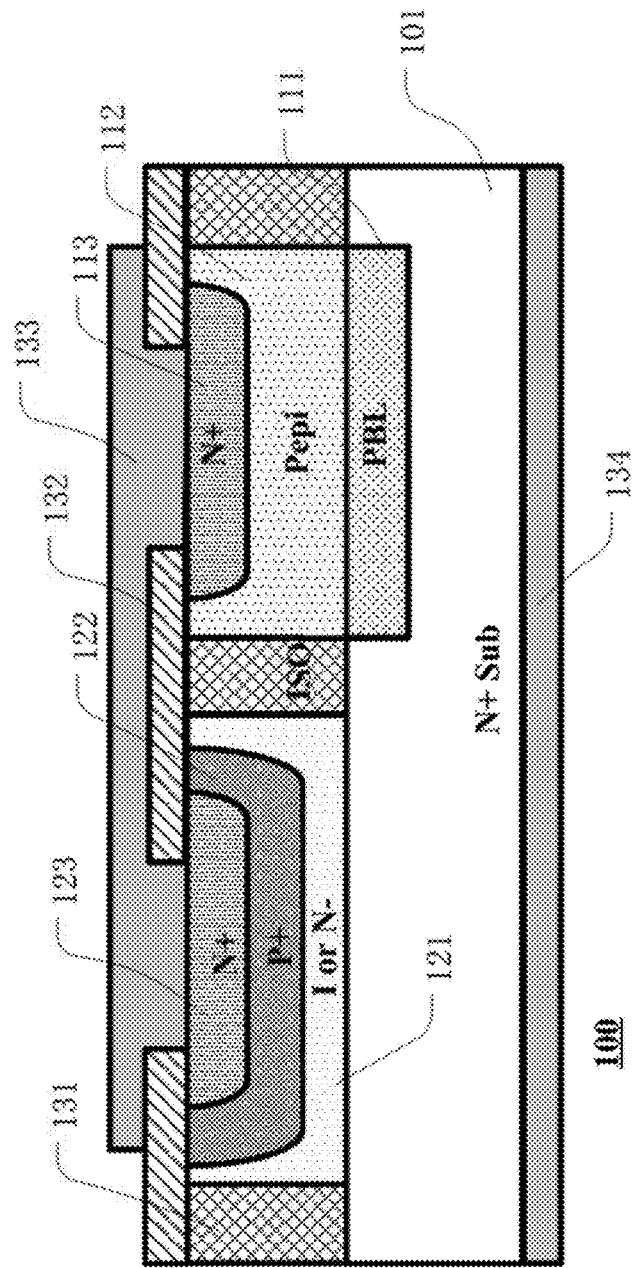
FIG. 1 is a cross-sectional view of an example bi-directional punch-through semiconductor device, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region. In contrast, when one layer is referred to as being "directly on" or "on and adjacent to" or to "adjoin" another layer or region, there may not be intervening layers or regions present. In the present application, when one region is referred to as being "directly in," it can be directly in another region and adjoining another region.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wire bonds. An encapsulant or other molding material is deposited over the package to provide physical support and electrical isolation. The finished package is then inserted into an electrical system and the functionality of the semiconductor device is made available to the other system components.

A zener diode is an electronic device for providing a stable voltage by utilizing an avalanche breakdown effect of a diode under a reverse voltage. For example, a zener diode may employ a P+N+ structure, and avalanche breakdown may happen when the reverse voltage is higher than a breakdown voltage, so as to provide a discharge path. A zener diode usually has a good voltage-stabilizing performance under a high operating voltage. However, a zener diode may have a relatively large leakage current and capacitance when the operating voltage is lower than 5V, which can result in higher power losses and limited operating frequency.

A punch-through diode can provide overvoltage protection by utilizing a punch-through phenomenon relative to a zener diode. A punch-through diode may have a low breakdown voltage, and can provide improved voltage-stabilizing functionality under a low operating voltage since the breakdown voltage may be lower than the avalanche breakdown voltage. For example, a punch-through diode may employ an N+P-P+N+ structure. That is, the punch-through diode may be substantially a back-to-back diode. Because of the reverse voltage which may be larger than the breakdown voltage, the space charge zones of two diodes may merge with each other, so punch-through breakdown may occur due to the current flow. The punch-through diode can reduce leakage current and capacitance, and may clamp voltage under a large current.

However, since the forward and reverse characteristics of a punch-through diode are typically not symmetrical, so two punch-through diodes can be reversely connected in parallel in order to achieve bi-directional protection. Such two punch-through diodes may also have the N+P-P+N+ structure, for a first punch-through diode, a P+ buried layer may be formed below a P− epitaxy layer, and for a second punch-through diode, a P+ doped region may be formed in the P− epitaxy layer. The structure may have adverse effects on the doping process and the punch-through performance in some cases. For example, the adjacent P+ buried layer and P− buried layer may be easily coupled, and the whole punch-through device may be unfavorably changed to a N+P+ N+ type of structure, potentially leading to failure of the punch-through device. In certain embodiments, performance of a punch-through diode can be improved, so as to reduce the number of diodes used for bi-directional protection, and to further reduce electronic circuit product costs.

In one embodiment, a bi-directional punch-through semiconductor device, can include: (i) a first transistor in a first region of a semiconductor substrate of a first conductivity type, where the first transistor includes a semiconductor buried layer of a second conductivity type in the semiconductor substrate, and a first epitaxy region of an epitaxy semiconductor layer above the semiconductor buried layer, the semiconductor buried layer being configured as a base of the first transistor; and (ii) a second transistor coupled in parallel with the first transistor, where the second transistor is in a second region of the semiconductor substrate of the first conductivity type, where the second transistor comprises a second epitaxy region of the epitaxy semiconductor layer above the semiconductor substrate, and a first doped region of the second conductivity type in the second epitaxy region, the first doped region being configured as a base of the second transistor, and where the first and second epitaxy regions have different conductivity types.

Referring now to FIG. 1, shown is a cross-sectional view of an example bi-directional punch-through semiconductor device, in accordance with embodiments of the present invention. In this particular example, bi-directional punch-through semiconductor device 100 may have first and second regions above N+ type substrate 101. Isolation structure 131 (e.g., an N type diffusion isolation region, a trench, etc.) can be employed to separate the first and second regions. In the first region, P type buried layer 111 can be formed near the surface of N+ type substrate 101, epitaxy region 112 of the epitaxy semiconductor layer can be formed on P type buried layer 111, and N+ type region 113 can be formed inside epitaxy region 112.

In the second region, epitaxy region 121 of the epitaxy semiconductor layer can be formed on N+ type substrate 101, p+ type region 122 can be formed inside epitaxy region 121, and N+ type region 123 can be formed inside P+ type region 122. Electrode 133 of bi-directional punch-through semiconductor device 100 can make contact with N+ type regions 113 and 123, and electrode 134 can make contact with N+ type substrate 101. Epitaxy regions 112 and 121 of the epitaxy semiconductor layer can be different conductivity types as being doped by the buried layer and the substrate, respectively. In this example, epitaxy region 112 is P type, and epitaxy region 121 is an intrinsic region. In an alternative example, epitaxy region 121 can be replaced by an N− layer. In this example, isolation structure 131 is a trench. In an alternative example, isolation structure 131 can be an N type doped diffusion region.

Figure 2:
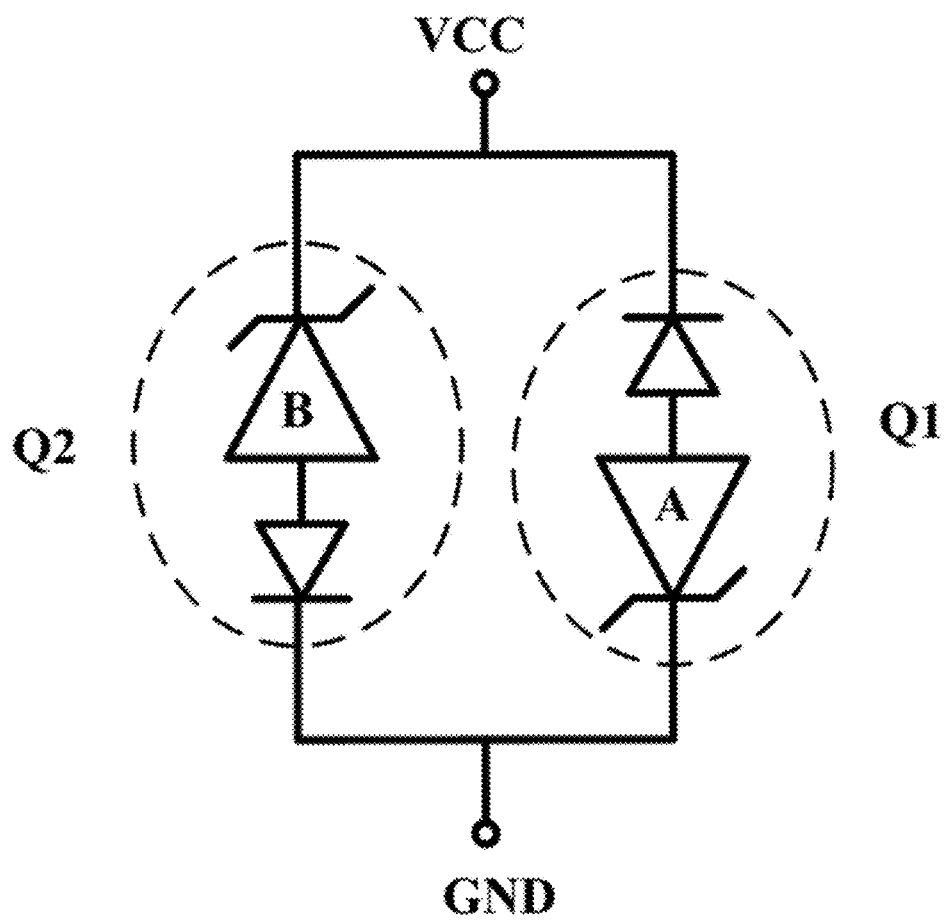
FIG. 2 shows an equivalent circuit diagram of an example bi-directional punch-through semiconductor device, in accordance with embodiments of the present invention.

Referring now to FIG. 2, shown is an equivalent circuit diagram of an example bi-directional punch-through semiconductor device, in accordance with embodiments of the present invention. Bi-directional semiconductor device 100 can include transistor Q1 formed in the first region, and transistor Q2 formed in the second region. Transistor Q1 can include a first diode and a second diode which are in a back-to-back structure. The first diode can include a first PN junction formed on the interface of P type buried layer 111 and N+ type substrate 101, and the second diode can include a second PN junction formed on the interface of epitaxy region 112 and N+ type region 113. A punch-through phenomenon can occur before the collector of transistor Q1 is in avalanche breakdown by regulating the doping concentration of P type buried layer 111 and the epitaxy semiconductor layer. For example, the doping concentration of P type buried layer 111 is from about 1E16 to about 1E18 atoms/cm3.

Transistor Q2 can include a third diode and a fourth diode which are in a back-to-back structure. The third diode can include a third PN junction formed on the interface of P+ type region 122 and N+ type region 123, and the fourth diode can include a fourth PN junction formed on the interface of P+ type region 122 and epitaxy region 121. A punch-through phenomenon can occur before the collector of transistor Q2 is in avalanche breakdown by regulating the doping concentration of P+ type region 122 and the epitaxy semiconductor layer. For example, the doping concentration of P+ type region 122 is from about 1E15 to about 5E18 atoms/cm3.

Figure 3:
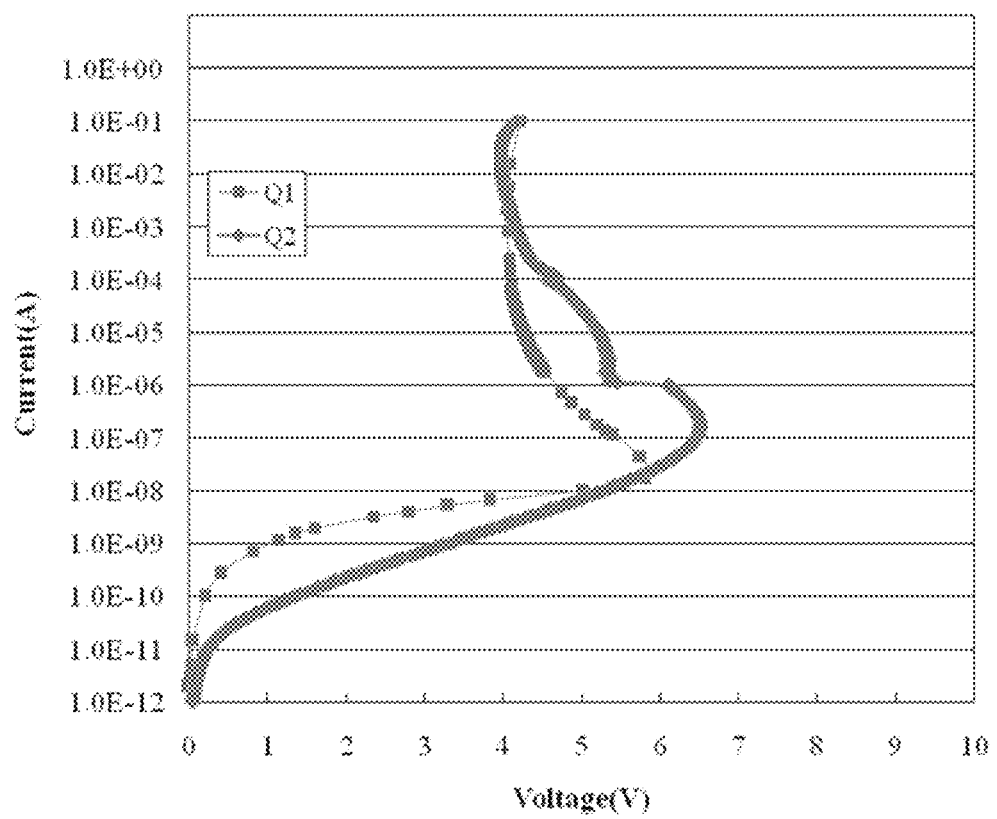
FIG. 3 is a testing plot showing example I-V characteristic of an example bi-directional punch-through semiconductor device, in accordance with embodiments of the present invention.

Referring now to FIG. 3, shown is a testing plot of example I-V characteristic of an example bi-directional punch-through semiconductor device, in accordance with embodiments of the present invention. Here, the forward and reverse clamp voltages may be maintained at about 4V when the current is 1.0E-4 (A), and the regulating range is 1-12V. Bi-directional electrostatic protection and overload protection can be provided by employing bi-directional punch-through semiconductor device 100 for ESD protection. If a negative ESD pulse emerges at electrode 133, transistor Q1 can be quickly turned on when a voltage across electrode 133 exceeds the punch-through voltage, a current through transistor Q1 can increase quickly, and the voltage across transistor Q1 may decrease until it is maintained at a relatively low adjustable voltage (e.g., a first holding voltage lower than the breakdown voltage). If a positive ESD pulse emerges at electrode 133, transistor Q2 may be quickly turned on when the voltage across electrode 133 exceeds the punch-through voltage, and the voltage across transistor Q2 can decrease until it is maintained at a relatively low adjustable voltage (e.g., a second holding voltage lower than the breakdown voltage).

In certain embodiments, a bi-directional punch-through semiconductor device can achieve bi-directional electrostatic protection or overload protection, and obtain a relatively low clamp voltage in both directions. The bi-directional punch-through semiconductor device can be well adapted to low voltage applications due to reduced product costs on a single IC, and may provide electrostatic and overload protection between interfaces (e.g., I/O-I/O, I/O-GND, VCC-GND, etc.).

Figure 4:
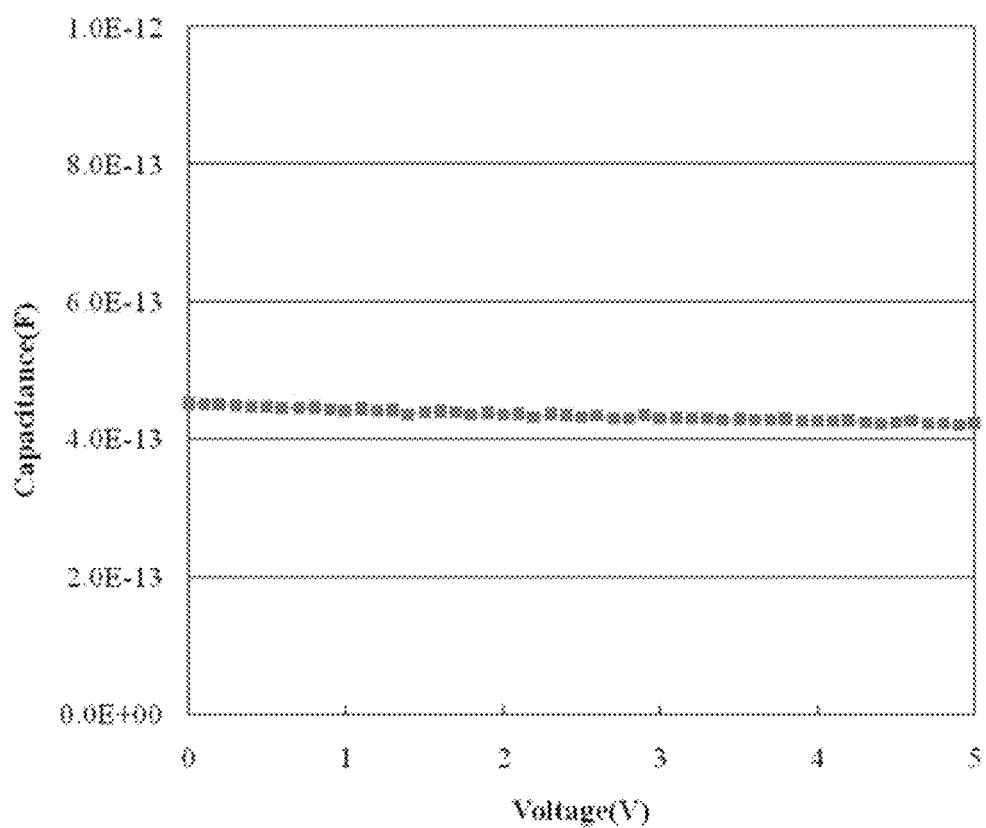
FIG. 4 is a testing plot showing example C-V characteristic of an example bi-directional punch-through semiconductor device, in accordance with embodiments of the present invention.

Referring now to FIG. 4, shown is a testing plot of example C-V characteristic of an example bi-directional punch-through semiconductor device, in accordance with embodiments of the present invention. Here, the parasitic capacitance of bi-directional punch-through semiconductor device 100 may have a value less than 5.0E-13 (F) when the operating voltage is in the range of from about 0V to do about 5V. Thus, the parasitic capacitance of the bi-directional punch-through semiconductor device may have a relatively low value in the operating range, so as to be suitable in a circuit interface of a high data-transfer rate (e.g., an Ethernet interface). Also, the value of the parasitic capacitance can be adjusted by regulating the doping concentration of the epitaxy semiconductor layer.

In one embodiment, a method of manufacturing a bi-directional punch-through semiconductor device, can include: (i) forming, in a semiconductor substrate of a first conductivity type, a semiconductor buried layer of a second conductivity type; (ii) forming an epitaxy semiconductor layer on the semiconductor substrate, where the epitaxy semiconductor layer includes a first epitaxy region and a second epitaxy region of different conductivity types;
(iii) forming a first doped region of the second conductivity type in the second epitaxy region;
(iv) forming a second doped region of the first conductivity type in the first epitaxy region; and
(v) forming a third doped region of the first conductivity type in the first doped region.

Figure 5A:
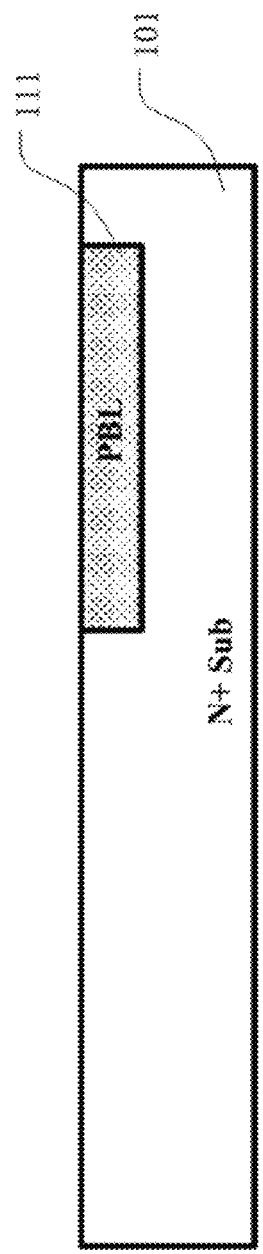
FIGS. 5A to 5F are cross-sectional views of an example bi-directional punch-through semiconductor device during various manufacturing steps, in accordance with embodiments of the present invention.

Referring now to FIGS. 5A to 5F, shown are cross-sectional views of an example bi-directional punch-through semiconductor device during various manufacturing steps, in accordance with embodiments of the present invention. As shown in FIG. 5A, P type buried layer 111 can be formed in N+ type substrate 101. P type buried layer 111 can be configured as a heavily doped base of transistor Q2. In one example, N+ type substrate 101 is a single-crystal silicon substrate. Also for example, the doping concentration of N+ type substrate 101 can be at least about 1E18atoms/cm3, such as greater than about 1E19atoms/cm3. The resistance of the substrate can be reduced by applying a relatively large doping concentration.

At this step, a photoresist layer can be formed on the surface of the N+ type substrate 101, and a mask may be formed by photoetching the photoresist layer. The mask can include an opening that partially exposes the surface of N+ type substrate 101. P type buried layer 111 can be formed on the exposed surface of N+ type substrate 101 by applying ion implantation and a driving-in process via the opening of the mask. P type buried layer 111 can extend to the N+ type substrate from the surface of N+ type 101. For example, the doping concentration of P type buried layer 111 can be from about 1E16 to about 1E18 atoms/cm3. Then, the photoresist mask may be removed by ashing or dissolution with a solvent.

Figure 5B:
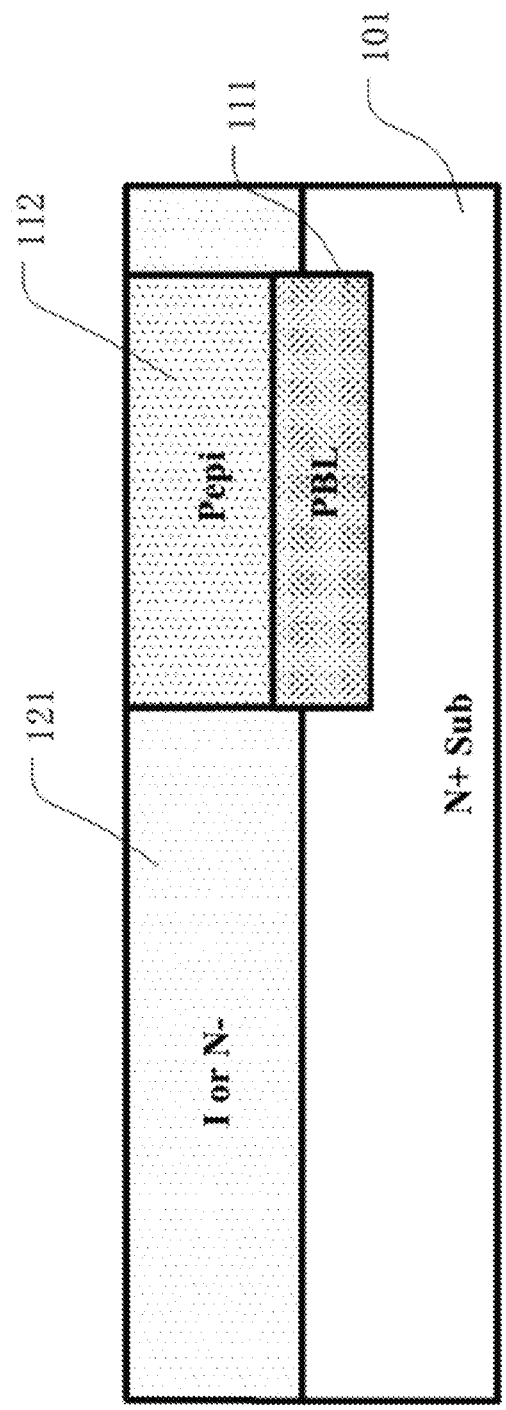

As shown in FIG. 5B, P-type semiconductor layer or region may be formed by implanting a P-type dopant (e.g., boron [B], etc.) in the semiconductor layer or region. By controlling implantation parameters, such as implantation energy and dosage, the dopant may reach a predetermined depth and have a predetermined doping concentration. An epitaxy semiconductor layer can be grown on the surface of N+ type substrate 101 including the P type buried layer through a deposition process. For example, the deposition process may be one selected from a group consisting of electron beam evaporation (EBM), chemical vapor deposition (CVD), atomic layer deposition (ALD), and sputtering. For example, the thickness of the epitaxy semiconductor layer can be from about 3 μm to about 10 μm. The epitaxy semiconductor layer can be an intrinsic layer, and may include an N type dopant (e.g., phosphorus [P], arsenic [As], etc.) of a certain doping concentration. In one example, the intrinsic doping concentration of the epitaxy semiconductor layer can be from about 1E11 to about 1E14 atoms/cm.

Dopant from the substrate may enter the epitaxy semiconductor layer during the epitaxy growth process because of an auto-doping effect, so as to change the conductivity of the epitaxy semiconductor layer. In this example, by regulating the intrinsic doping concentration of the epitaxy semiconductor layer, the contact portion of the epitaxy semiconductor layer and P type buried layer 111 may form epitaxy region 112, and the contact portion of the epitaxy semiconductor layer and N+ type substrate 101 may form epitaxy region 121.

Figure 5C:
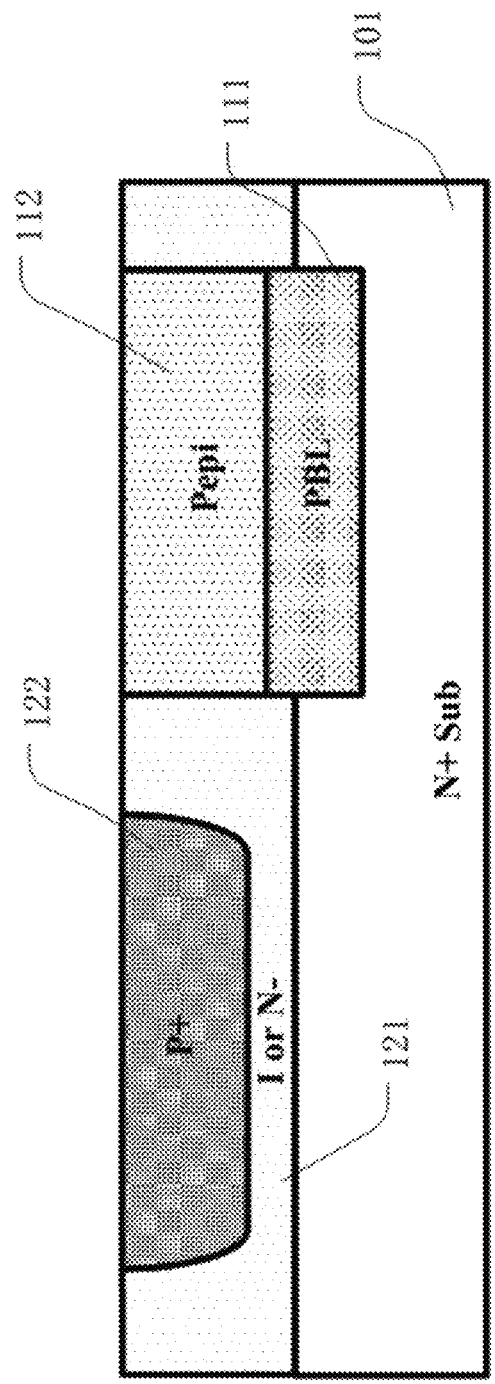

In an alternative example, epitaxy region 112 may substantially be doped as a P-type layer by auto-doping the epitaxy semiconductor layer through P type buried layer 111. In another alternative example, epitaxy region 121 may substantially be doped as a N– type layer by auto-doping the epitaxy semiconductor layer through N+ type substrate 101. P+ type region 122 may also be formed in epitaxy region 121, as shown in FIG. 5C. P+ type region 122 can be configured as a heavily doped base of transistor Q2. Thus, the value of the parasitic capacitance of forward-biased transistor Q2 can be adjusted by regulating the doping concentration of the epitaxy semiconductor layer.

At this step, the photoresist layer can be formed on the surface of the semiconductor structure that is relative to N+ type substrate 101, and the mask can be formed by photoetching the photoresist layer. The mask can include an opening that partially exposes the surface of epitaxy region 121. P+ type region 122 can be formed in epitaxy region 121 by applying ion implantation and a driving-in process via the opening of the mask. P+ type region 122 can extend to epitaxy region 121 from the surface of epitaxy region 121. For example, the doping concentration of P+ region 122 can be from about 1E15 to about 5E18 atoms/cm3. Then, the photoresist mask may be removed by ashing or dissolution with a solvent.

Figure 5D:
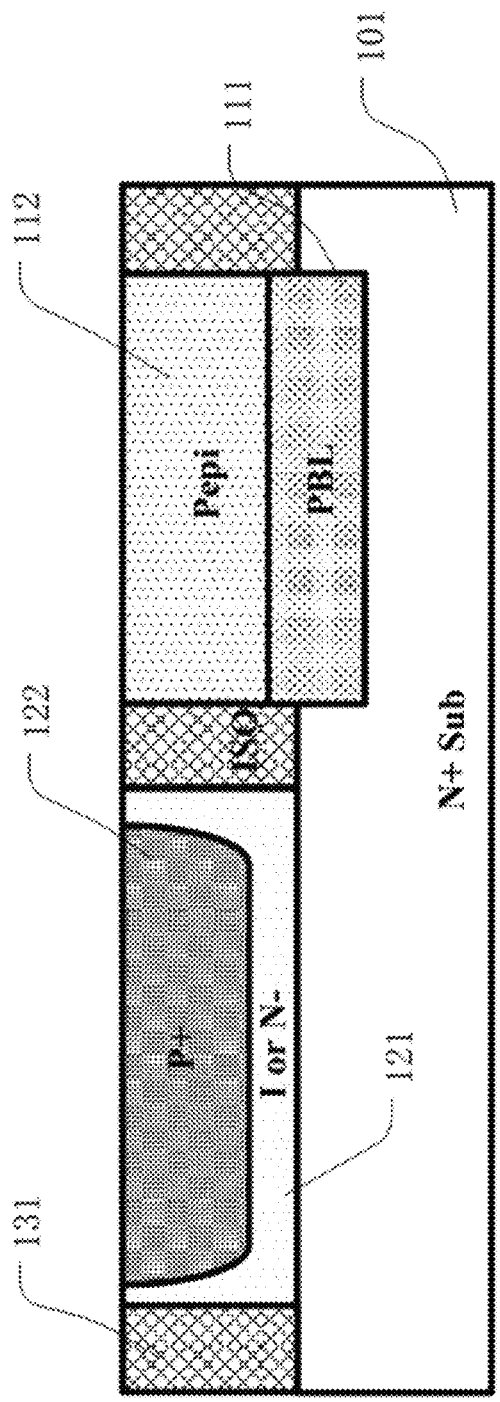

Isolation structure 131 can be formed to define the active regions of transistors Q1 and Q2, as shown in FIG. 5D. For example, isolation structure 131 is an N type isolation region. Isolation structure 131 can extend to the N+ type substrate from the main surface of the whole semiconductor structure, such that P type buried layer 111 and epitaxy region 112 of the first region are spaced from epitaxy region 121 and P+ type region 122 of the second region.

Isolation structure 131 can be configured to define the active regions of transistors Q1 and Q2. In this example, one side of at least one part of isolation structure 131 adjoins P type buried layer 111 and epitaxy region 112, and the other side adjoins epitaxy region 121, such that P type buried layer 111 and epitaxy region 121 are spaced from each other to avoid punch-through. In an alternative example, if the distance between transistors Q1 and Q2 is large enough to avoid punch-through, isolation structure 131 between transistors Q1 and Q2 may be avoided.

At this step, the photoresist layer can be formed on the surface of the semiconductor structure that is relative to N+ type substrate 101, and the mask may be formed by photoetching the photoresist layer. The mask can include an opening that partially exposes the surface of epitaxy region 121. N+ type isolation structure 131 around P+ type region 122 can be formed in epitaxy region 121 by applying ion implantation and a driving-in process via the opening of the mask. Isolation structure 131 can extend to N+ type substrate 101 from the surface of epitaxy region 121. Then, the photoresist mask may be removed by ashing or dissolution with a solvent.

An N-type semiconductor layer or region may be formed by implanting an N-type dopant (e.g., P, As, etc.) in the semiconductor layer or region. By controlling implantation parameters, such as implantation energy and dosage, the dopant may reach a predetermined depth and have a predetermined doping concentration. In one example, N type isolation structure 131 can be formed in epitaxy region 121 after forming P+ type region 122. In an alternative example, N type isolation structure 131 may be formed in epitaxy region 121 after epitaxy region 121 but before P+ type region 122.

Figure 5E:
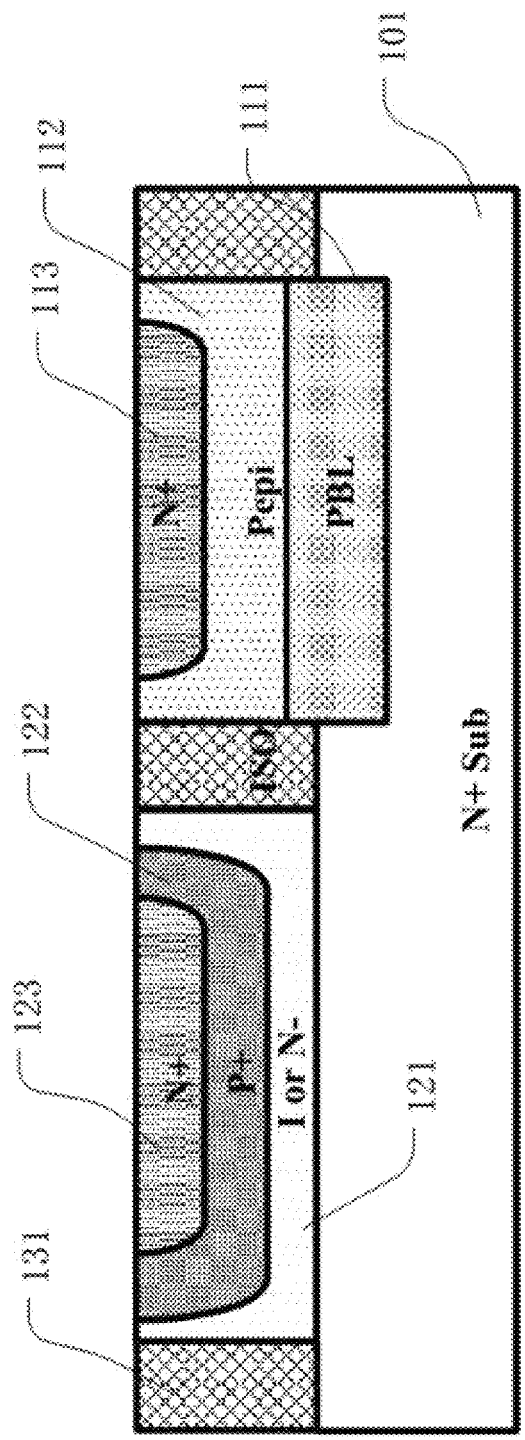

In another alternative example, isolation structure 131 may be a trench formed in any step after epitaxy region 121 is formed. The trench can be formed by any suitable process, such as including etching a shallow trench in a semiconductor structure and filling the shallow trench by insulating material. In addition, N+ type region 113 can be formed in epitaxy region 112, and N+ type region 123 can be formed in P+ type region 122, as shown in FIG. 5E.

At this step, the photoresist layer can be formed on the surface of the semiconductor structure that is relative to N+ type substrate 101, and the mask may be formed by photoetching the photoresist layer. The mask can include a first opening that partially exposes the surface of epitaxy region 112, and a second opening that partially exposes the surface of P+ type region 122. N+ type region 113 can be formed in epitaxy region 112 and N+ type region 123 may be formed in P+ type region 122 by applying ion implantation and a driving-in process via the first and second openings of the mask. N+ type region 113 can extend downwards to epitaxy region 112 from the surface of epitaxy region 112. N+ type region 123 may extend downwards from the surface of P+ type region 122. For example, the doping concentrations of N+ type regions 113 and 123 can be from about 1E17 to about 1E21 atoms/cm3. Then, the photoresist mask can be removed by ashing or dissolution with a solvent.

Interlayer dielectric layer 132 can be formed on the surface of the semiconductor structure that is relative to N+ type substrate 101 by the above-mentioned deposition process. For example, interlayer dielectric layer 132 can be made of silicon oxide. Then, openings respectively reaching N+ type regions 113 and 123 may be formed in interlayer dielectric layer 132, such as by photoetching and etching.

Figure 5F:
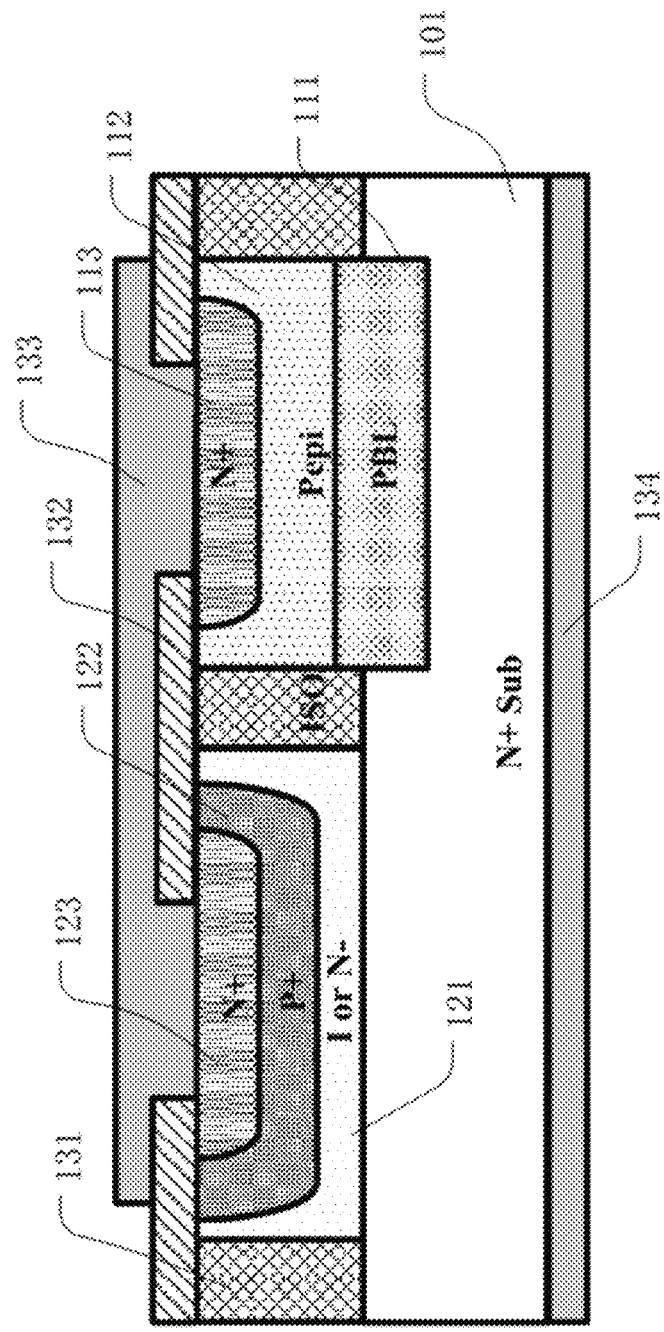

Electrode 133 can be formed on insulating layer 132, such as by the above-mentioned deposition process. Similarly, electrode 134 can be formed on the surface of N+ type substrate 101 that is relative to electrode 133, as shown in FIG. 5F.

Electrodes 133 and 134 can be made of a metal material (e.g., gold, silver, copper, etc.). Electrode 133 may make contact with N+ type regions 113 and 123 via the opening in the insulating layer. Electrode 134 can directly make contact with N+ type substrate 101. In the above described examples, electrode 134 can be formed after electrode 133. In an alternative example, the corresponding surface of N+ type substrate 101 may not be affected by any intermediate steps, and thus electrode 134 can be formed in any suitable step. For example, electrode 134 can be formed before the step shown in FIG. 5A.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of manufacturing a bi-directional punch-through semiconductor device, the method comprising:
   a) forming, in a semiconductor substrate of a first conductivity type, a semiconductor buried layer of a second conductivity type;
   b) forming an epitaxy semiconductor layer on said semiconductor substrate, wherein said epitaxy semiconductor layer comprises a first epitaxy region and a second epitaxy region of different conductivity types;
   c) forming a first doped region of said second conductivity type in said second epitaxy region;
   d) forming a second doped region of said first conductivity type in said first epitaxy region; and
   e) forming a third doped region of said first conductivity type in said first doped region.

2. The method of claim 1, wherein said first epitaxy region is of said second conductivity type.

3. The method of claim 1, wherein said second epitaxy region is one of an intrinsic characteristic or said first conductivity type.

4. The method of claim 1, further comprising, after forming said epitaxy semiconductor layer, forming an isolation structure in said epitaxy semiconductor layer, wherein said isolation structure extends to said semiconductor substrate from the surface of said epitaxy semiconductor layer to separate said second epitaxy region from said semiconductor buried layer.

5. The method of claim 1, further comprising:
   a) after forming said second doped region and said third doped region, forming a first electrode contacting with said second and third doped regions; and
   b) forming a second electrode that contacts with said semiconductor substrate.

6. The method of claim 1, wherein said first conductivity type is selected from one of N type and P type, and said second conductivity type is selected from the other of N type and P type.

7. The method of claim 1, wherein said first and second epitaxy regions are respectively auto-doped by said semiconductor buried layer and said semiconductor substrate.

8. The method of claim 1, wherein a first transistor comprises a second doped region of said first conductivity type in said first epitaxy region, and a second transistor comprises a third doped region of said first conductivity type in said first doped region.

9. The method of claim 8, further comprising:
   a) forming a first PN junction between said semiconductor buried layer and said semiconductor substrate;
   b) forming a second PN junction between said first epitaxy region and said second doped region;
   c) forming a third PN junction between said first and third doped regions; and
   d) forming a fourth PN junction between said first doped region and said second epitaxy region.

10. The method of claim 9, further comprising forming an isolation structure for defining active regions of said first and second transistors.

11. The method of claim 10, wherein said isolation structure comprises a first side that adjoins said semiconductor buried layer and said first epitaxy region, and a second side that adjoins said second epitaxy region.

12. The method of claim 11, wherein said isolation structure is selected from a trench and a doped diffusion region of said first conductivity type.

13. The method of claim 12, wherein said doped diffusion region extends to said semiconductor substrate from the surface of said epitaxy semiconductor layer.

14. The method of claim 9, wherein said punch-through occurs instead of avalanche breakdown when said first and third PN junctions withstand a reverse voltage higher than a breakdown voltage.

15. The method of claim 9, wherein said first PN junction is punched through by regulating the doping concentration of said semiconductor buried layer and said epitaxy semiconductor layer.

16. The method of claim 9, wherein said third PN junction is punched through by regulating the doping concentration of said first doped region and said epitaxy semiconductor layer.

* * * * *